US012648242B2

(12) United States Patent
Huang et al.

(10) Patent No.: US 12,648,242 B2
(45) Date of Patent: Jun. 2, 2026

(54) SOURCE FOLLOWER CIRCUIT

(71) Applicant: REALTEK SEMICONDUCTOR CORPORATION, Hsinchu (TW)

(72) Inventors: Shih-Hsiung Huang, Hsinchu (TW); Chia-Wei Kao, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 729 days.

(21) Appl. No.: 17/821,804

(22) Filed: Aug. 24, 2022

(65) Prior Publication Data

US 2023/0307476 A1 Sep. 28, 2023

(30) Foreign Application Priority Data

Mar. 24, 2022 (TW) ................................... 111111178

(51) Int. Cl.
H03F 3/45 (2006.01)
H03K 5/04 (2006.01)
H10F 39/00 (2025.01)

(52) U.S. Cl.
CPC ... H10F 39/80373 (2025.01); H03F 3/45179 (2013.01); H03K 5/04 (2013.01)

(58) Field of Classification Search
CPC ............................. H10F 39/80373; H03K 5/04
USPC ......................................................... 330/253
See application file for complete search history.

(56) References Cited

U.S. PATENT DOCUMENTS 7,019,580 B1 3/2006 Michalski
7,675,273 B2 3/2010 Ko

| | | |
|---|---|---|
| 8,487,922 B2 | 7/2013 | Brown |
| 9,231,579 B2 | 1/2016 | Sun |
| 9,489,988 B2 | 11/2016 | Yamazaki |
| 10,497,454 B2 | 12/2019 | Ma |
| 11,417,263 B2 | 8/2022 | Feng |
| 12,176,171 B2 | 12/2024 | Liu |
| 2003/0030617 A1 | 2/2003 | Han |
| 2009/0237125 A1 | 9/2009 | Zhao |
| 2011/0109350 A1 | 5/2011 | Chaji |
| 2011/0169556 A1 | 7/2011 | Kimura |
| 2011/0273239 A1 | 11/2011 | Lee |
| 2016/0112046 A1 | 4/2016 | Wu |
| 2017/0019095 A1 | 1/2017 | Leong |
| 2022/0045683 A1 | 2/2022 | Inoue |

(Continued)

OTHER PUBLICATIONS

Office action from the U.S. patent family dated Oct. 17, 2025.
Notice of Allowance from the U.S. Appl. No. 17/821,796 dated Mar. 5, 2026.

*Primary Examiner* — Andrea Lindgren Baltzell
*Assistant Examiner* — Khiem D Nguyen
(74) *Attorney, Agent, or Firm* — WPAT, P.C.; Anthony King

(57) ABSTRACT

The present application discloses a source follower circuit, arranged for generating output signal according to input signal. The circuit includes: a first transistor having a drain coupled to a first reference voltage; a second transistor having a drain coupled to a source of the first transistor, and the first transistor and the second transistor both have polarization of a first type; a first capacitor, coupled between a gate of the first transistor and the input signal; and a first resistor, coupled between the gate of the first transistor and a first bias voltage; wherein a gate of the second transistor is coupled to the input signal, and a source of the second transistor outputs the output signal.

12 Claims, 10 Drawing Sheets

600

V1

VB1 — R1 — M1
C1
VIN

VB2 — R2 — M2
C2
VIN

VB4 — R4 — C4 — M4
VO

VIN — C3

VB3 — R3 — M3

V2

(56) References Cited

U.S. PATENT DOCUMENTS

| | | |
|---|---|---|
| 2023/0283276 A1 | 9/2023 | Ikeda |
| 2023/0307476 A1 | 9/2023 | Huang |

100

200

300

VO

M4

M3

V2

VIN

VIN

C3

R3

VB3

500

700

SOURCE FOLLOWER CIRCUIT

CROSS-REFERENCE TO RELATED APPLICATIONS

This application claims priority of Taiwan application No. 111111178 filed on Mar. 24, 2022, which is incorporated by reference in its entirety.

TECHNICAL FIELD

The present application relates to a circuit, particularly to a source follower circuit.

BACKGROUND

The input signal of a source follower is input from the gate of a transistor, so that the voltage of the source of the transistor will follow the input signal voltage. The source follower is often used as a driver circuit. Therefore, it is important to improve the ability of the source follower power to suppress the power supply noise in order to increase the power supply rejection ratio (PSRR), so as to improve the signal-to-noise ratio (SNR) of the source follower.

SUMMARY OF THE INVENTION

The present application provides a source follower circuit, configured to generate an output signal according to an input signal, the source follower circuit including: a first transistor, having a drain coupled to a first reference voltage; a second transistor, having a drain coupled to a source of the first transistor, and the first transistor and the second transistor both have polarization of a first type; first capacitor, coupled between a gate of the first transistor and the input signal; and a first resistor, coupled between the gate of the first transistor and a first bias voltage; wherein a gate of the second transistor is coupled to the input signal, a source of the second transistor outputs the output signal.

The present application provides a source follower circuit, configured to generate an output signal according to an input signal, the source follower circuit including: a first transistor, having a drain coupled to a first reference voltage; a second transistor, having a drain coupled to a source of the first transistor, and the first transistor and the second transistor both have polarization of a first type; a first capacitor, coupled between a gate of the first transistor and the input signal; a first resistor, coupled between the gate of the first transistor and a first bias voltage; a second capacitor, coupled between a gate of the second transistor and the input signal; and a second resistor, coupled between the gate of the second transistor and a second bias voltage; wherein a source of the second transistor outputs the output signal.

The present disclosure increases the PSRR of a source follower.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
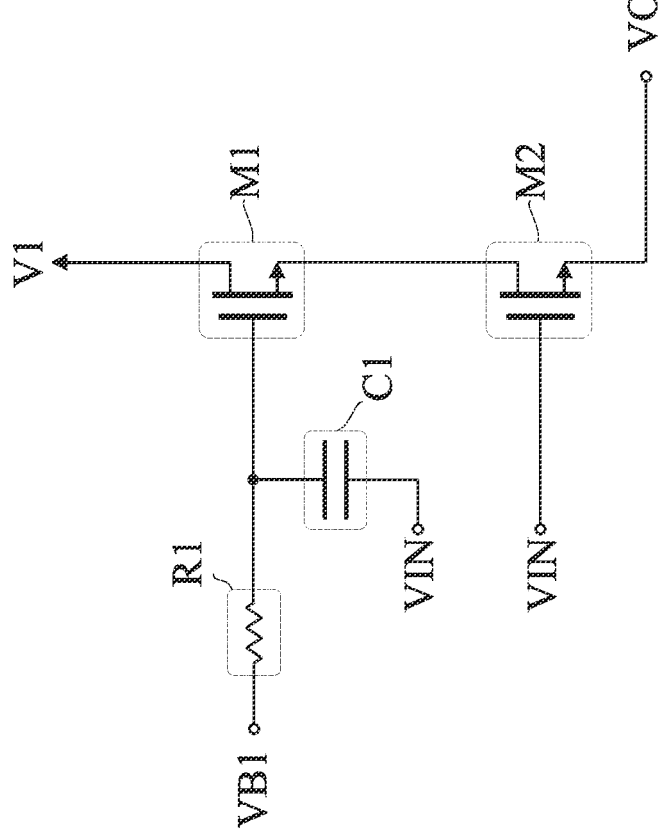
FIG. 1 is a schematic diagram of a source follower circuit according to a first embodiment of the present disclosure.

FIG. 1 is a schematic diagram of a source follower circuit according to the first embodiment of the present disclosure. The source follower circuit 100 is configured to generate an output signal VO according to an input signal VIN to drive a following load. The source follower circuit 100 includes a transistor M1, a transistor M2, a capacitor C1 and a resistor R1. In this case, the transistor M1 and the transistor M2 are arrange in a way of cascode, such that the source of the transistor M1 is coupled to the drain of the transistor M2, and the drain of the transistor M1 is coupled to the reference voltage V1. The transistor M2 is used as the main source follower of the source follower circuit 100, and is configured to generate the output signal VO according to the input signal VIN of the gate. The transistor M1 is arranged such that the drain voltage of the transistor M2 is related to the input signal VIN; in this way, the drain-source voltage of the transistor M2 can be kept as unchanged as much as possible when the input signal VIN varies, so that the transconductance of the transistor M2 is constant as much as possible, thereby increasing the linearity of the output signal VO. Moreover, limiting the drain-source voltage of the transistor M2 can at the same time inhibit the channel length modulation effect.

Because the function of the transistor M1 is to assist the transistor M2, instead of applying the full input signal VIN at the gate of the transistor M1, a voltage divider circuit is used to equivalently provide a gain less than 1 to the input signal VIN and generate an attenuated input signal reflected at the gate of the transistor M1. In the present embodiment, the capacitor C1 and the resistor R1 are used to form the voltage divider circuit, wherein the capacitor C1 is coupled between the gate of the transistor M1 and the input terminal of the input signal VIN. The resistor R1 is coupled between the gate of the transistor M1 and the input terminal of the bias voltage VB1. In this case, the bias voltage VB1 is configured to determine the DC voltage at the gate of the transistor M1 terminal.

Generally, to increase the operational frequency of the source follower circuit 100, the channel aspect ratio of the transistor M1 and transistor M2 is often designed to be greater, so as to increase the current that can drive the following load quickly; in this way, the parasitic capacitor of the transistor M1 and transistor M2 is relatively greater. Therefore, when the power supply noise carried in the reference voltage V1 enters the drain of the transistor M1, the gate-drain coupling capacitor of the transistor M1 will couple the noise to the gate of the transistor M1, but the noise cannot affect the gate of the transistor M2 through the capacitor C1, and hence will not be reflected on the output voltage VO. Even if the noise can be reflected at the gate of the transistor M2 through other paths, but the effect is insignificant. In other words, the present disclosure increases the PSRR and SNR of the source follower circuit 100 by making sure that the noise cannot affect the gate of the transistor M2 through the capacitor C1.

Figure 2:
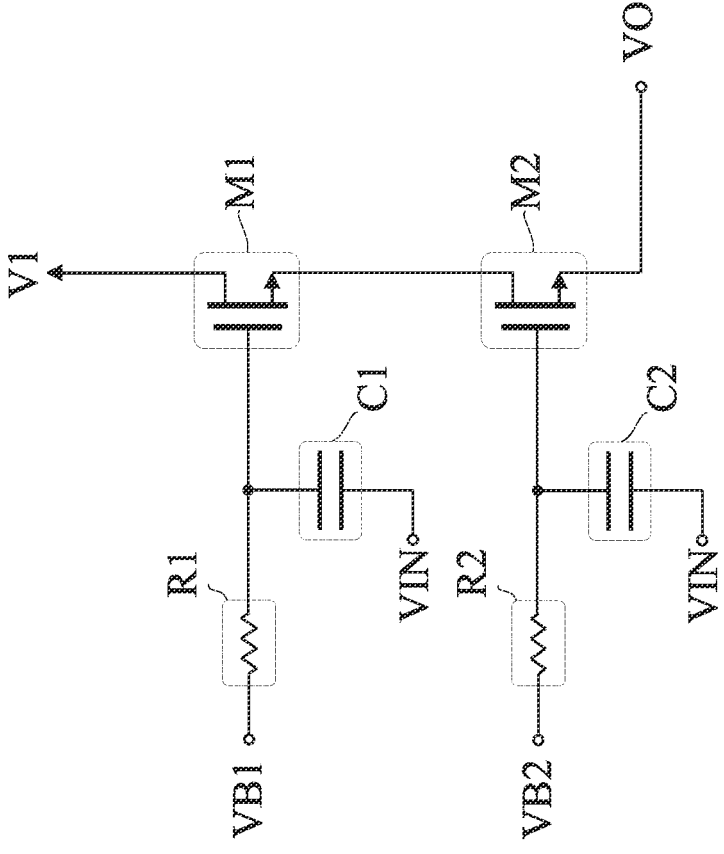
FIG. 2 is a schematic diagram of a source follower circuit according to a second embodiment of the present disclosure.
Figure 3:
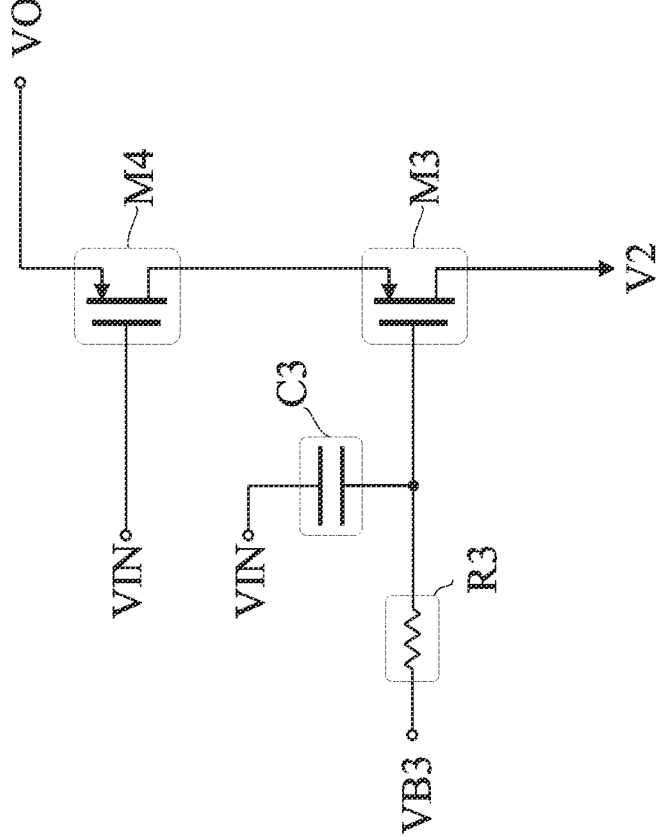
FIG. 3 is a schematic diagram of a source follower circuit according to a third embodiment of the present disclosure.
Figure 4:
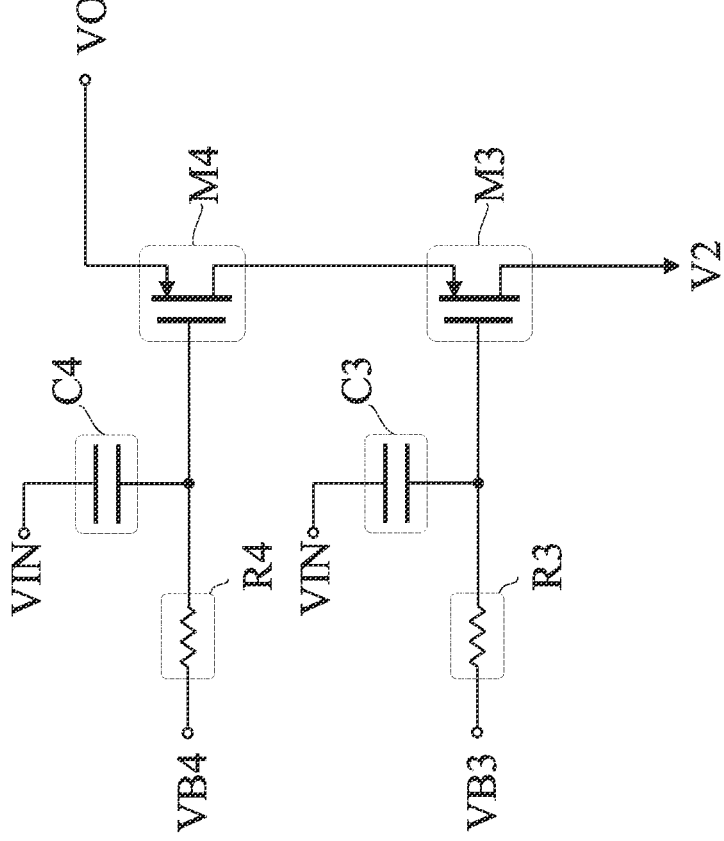
FIG. 4 is a schematic diagram of a source follower circuit according to a fourth embodiment of the present disclosure.

In certain embodiments, the input voltage VIN can be divided before being input into the gate of transistor M2, as shown in the embodiment of FIG. 2. The source follower circuit 200 has an additional capacitor C2 and resistor R2 compared to the source follower circuit 100 of FIG. 1, wherein the capacitor C2 is coupled between the gate of transistor M2 and the input signal VIN. The resistor R2 is coupled between the gate of transistor M2 and the input of bias VB2. Since transistor M2 is the main source follower in the source follower circuit 200, the capacitance of capacitor C2 is larger than that of capacitor C1, so that the gate of transistor M2 is subject to more influence from the input signal VIN, compared to the gate of transistor M1 is. In other words, the equivalent gain of capacitor C2 and resistor R2 to the input voltage VIN is greater than the equivalent gain of capacitor C1 and resistor R1 to the input voltage VIN. The bias voltage VB2 is configured to determine the DC voltage at the gate of transistor M2, and the bias voltage VB1 and bias voltage VB2 can be different.

It is noted that the path between the input signal VIN and the gate of the transistor M2 only passes through the capacitor C2 but not the capacitor C1; the path between the input signal VIN and the gate of the transistor M1 only passes through the capacitor C1 but not the capacitor C2. Therefore, the power supply noise carried in the reference voltage V1 cannot affect the gate of the transistor M2 through the capacitor C1, and hence, it will not be reflected on the output voltage VO.

Both the embodiments of the source follower circuit 100 and the source follower circuit 200 use N-type transistors, however the present disclosure is not limited thereto. For example, both the source follower circuit 300 and the source follower circuit 400 use P-type transistors.

The source follower circuit 300 includes a transistor M3, a transistor M4, a capacitor C3 and a resistor R3. In this case, the transistor M3 and the transistor M4 are arranged in a way of cascade, such that the source of the transistor M3 is coupled to the drain of the transistor M4, and the drain of the transistor M3 is coupled to the reference voltage V2. The transistor M4 is used as the main source follower in the source follower circuit 300 and is configured to generate the output signal VO according to of the gate the input signal VIN. The transistor M3 is arranged such that the drain voltage of the transistor M4 can be related to the input signal VIN. The capacitor C3 and the resistor R3 form the voltage divider circuit, configured to equivalently provide a gain less than 1 to the input signal VIN and generate an attenuated input signal reflected at the gate of the transistor M3. In this case, the capacitor C3 is coupled between the gate of the transistor M3 and the input signal VIN. The resistor R3 is coupled between the gate of the transistor M3 and the bias voltage VB3. In this case, the bias voltage VB3 is configured to determine the DC voltage at the transistor M3 gate.

The source follower circuit 400 has an additional capacitor C4 and resistor R4 compared to the source follower circuit 300. In this case, the capacitor C4 is coupled between the gate of the transistor M4 and the input terminal of the input signal VIN. The resistor R4 is coupled between the gate of the transistor M4 and the input terminal of the bias voltage VB4. Because the transistor M4 is the main source follower in the source follower circuit 400, the capacitance of the capacitor C4 is greater than the capacitance of the capacitor C3, such that the gate of the transistor M4 is subject to more influence from the input signal VIN, compared to the gate of the transistor M3 is. In this case, the bias voltage VB4 is configured to determine the DC voltage of the transistor M4, and the bias voltage VB3 and the bias voltage VB4 can be different.

Similarly, in the source follower circuit 300 and the source follower circuit 400, the noise of reference voltage V2 cannot affect the gate of the transistor M4 through the capacitor C3, and hence, the PSRR and SNR can be increased.

Figure 5:
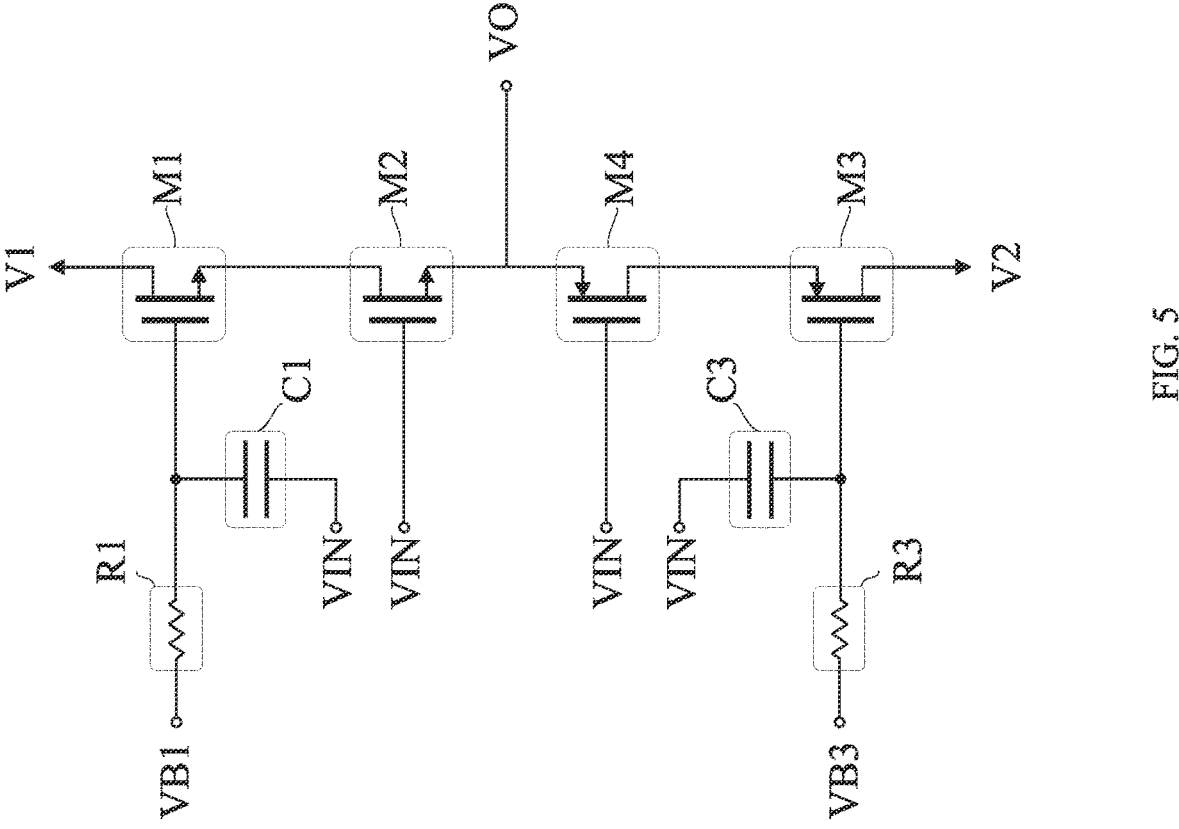
FIG. 5 is a schematic diagram of a source follower circuit according to a fifth embodiment of the present disclosure.
Figure 6:
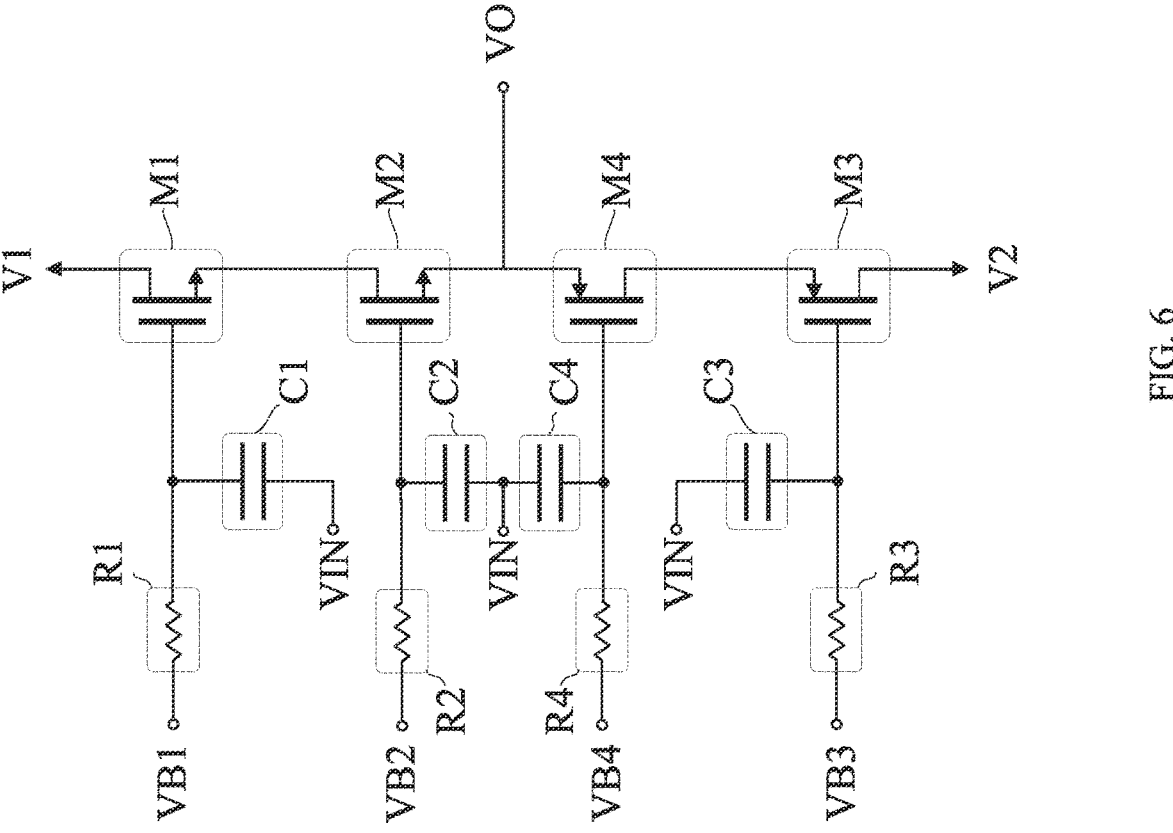
FIG. 6 is a schematic diagram of a source follower circuit according to a sixth embodiment of the present disclosure.
Figure 7:
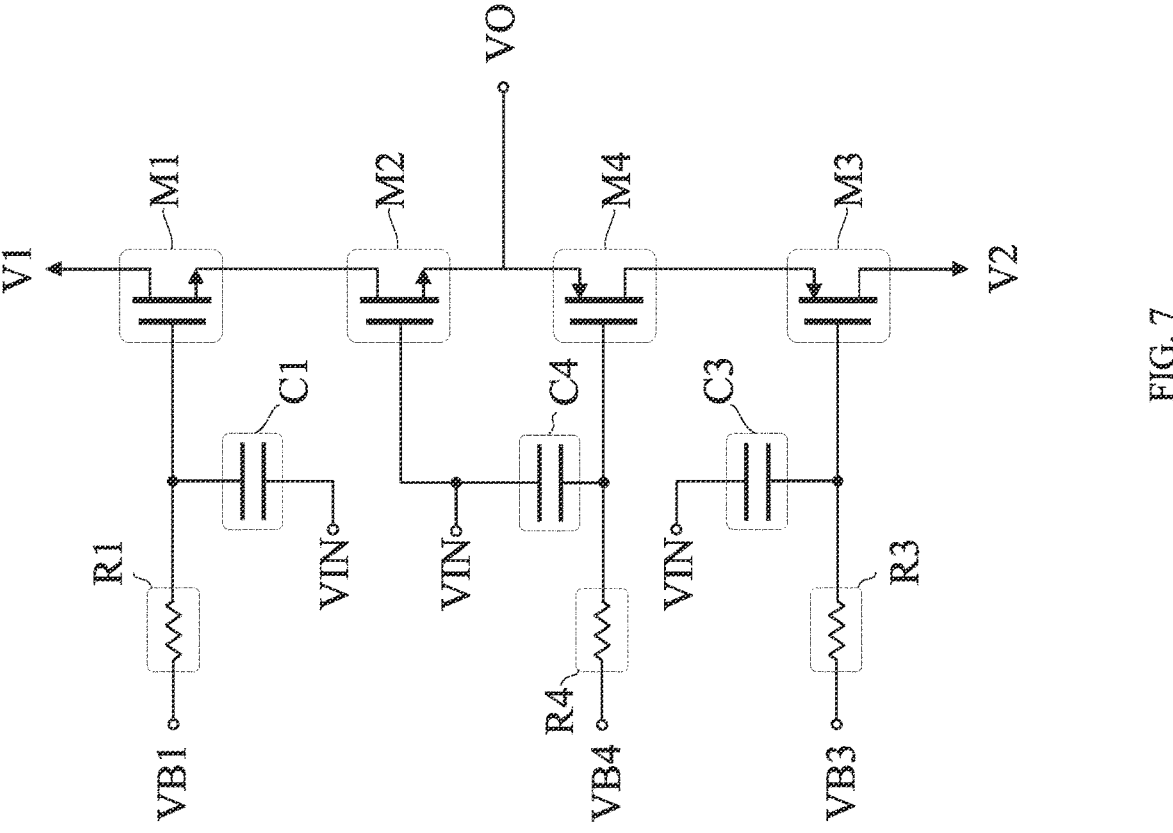
FIG. 7 is a schematic diagram circuit of a source follower circuit according to a seventh embodiment of the present disclosure.
Figure 8:
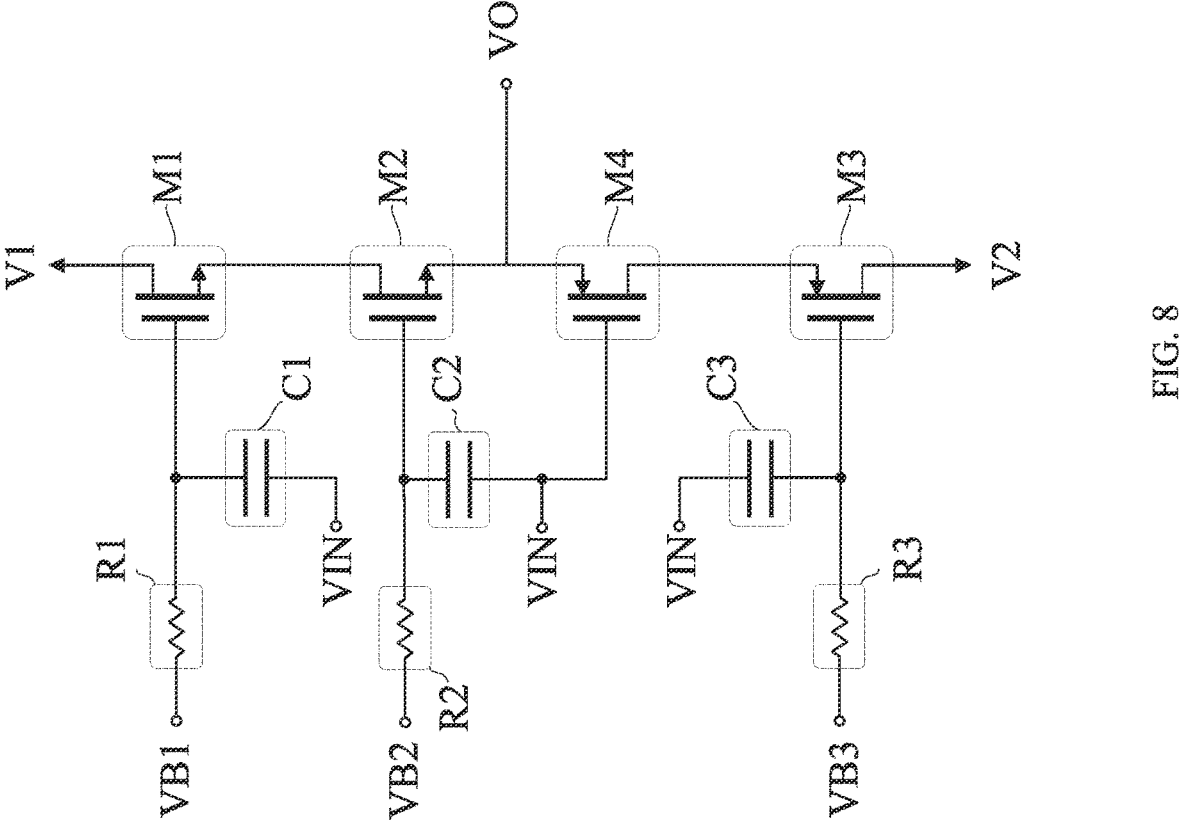
FIG. 8 is a schematic diagram of a source follower circuit according to an eighth embodiment of the present disclosure.

In certain embodiments, the source follower circuits 100/200 can be combined with the source follower circuits 300/400. For example, the source follower circuit 100 is combined with the source follower circuit 300 to form the source follower circuit 500 of FIG. 5; the source follower circuit 200 is combined with the source follower circuit 400 to form the source follower circuit 600 of FIG. 6; the source follower circuit 100 is combined with the source follower circuit 400 to form the source follower circuit 700 of FIG. 7; the source follower circuit 200 is combined with the source follower circuit 300 to form the source follower circuit 800 of FIG. 8.

Figure 9:
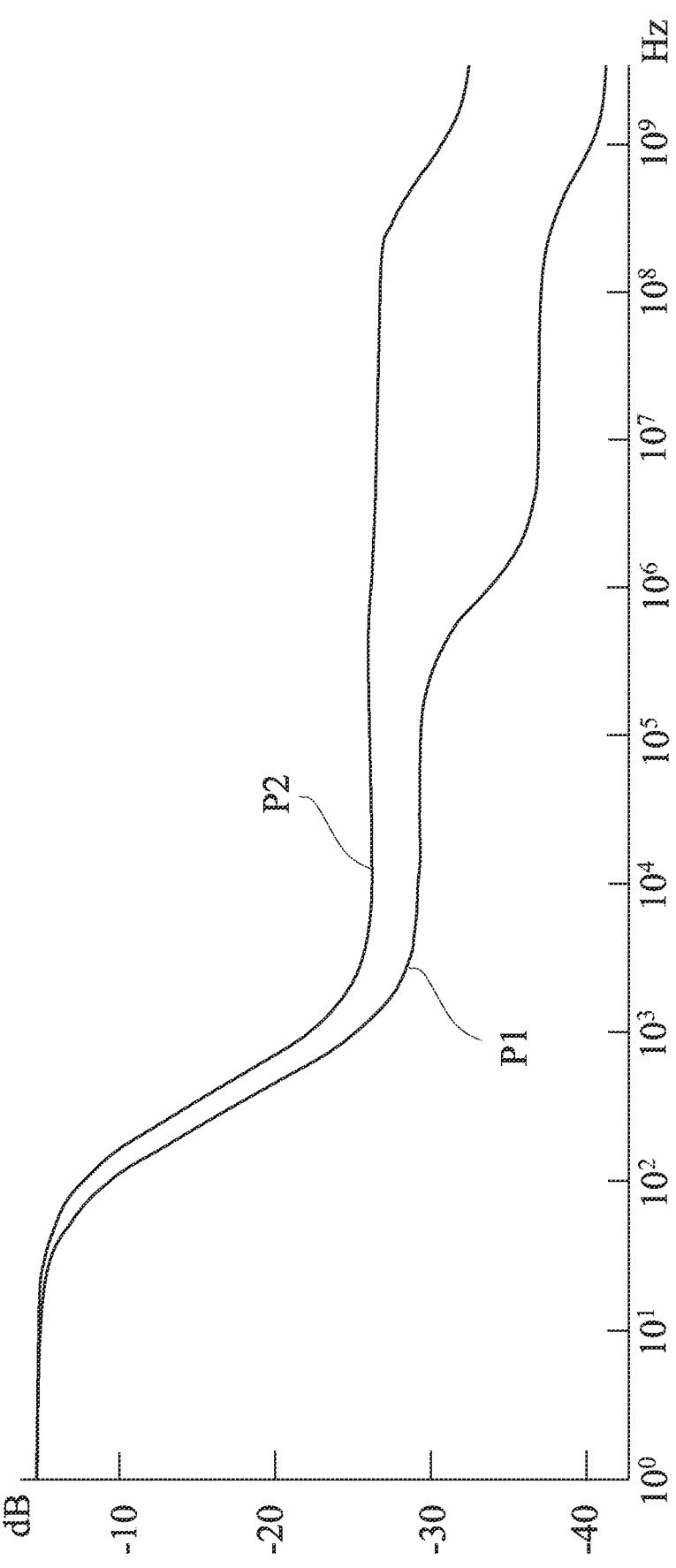
FIG. 9 shows a comparison result of PSRR between a source follower circuit according to the present disclosure and a conventional source follower circuit.

FIG. 9 shows the comparison result of PSRR between the source follower circuit according to the present disclosure and a conventional source follower circuit. The results can be obtained using simulation software, wherein the horizontal axis represents the frequency and the vertical axis represents the dB value of the output voltage VO, which is configured to reflect the response of the reference voltage V1 or the reference voltage V2 to the output voltage VO. As shown in FIG. 9, compared with the response curve P2 of a conventional source follower circuit, the response curve P1 of the source follower circuit of the present disclosure has a lower dB value; that is, the noise of the reference voltage V1 or the reference voltage V2 is less likely to be reflected on the output voltage VO, thereby having a better PSRR. The PSRR is improved by about 10 dB, especially for the high frequency part that is most difficult to handle.

Figure 10:
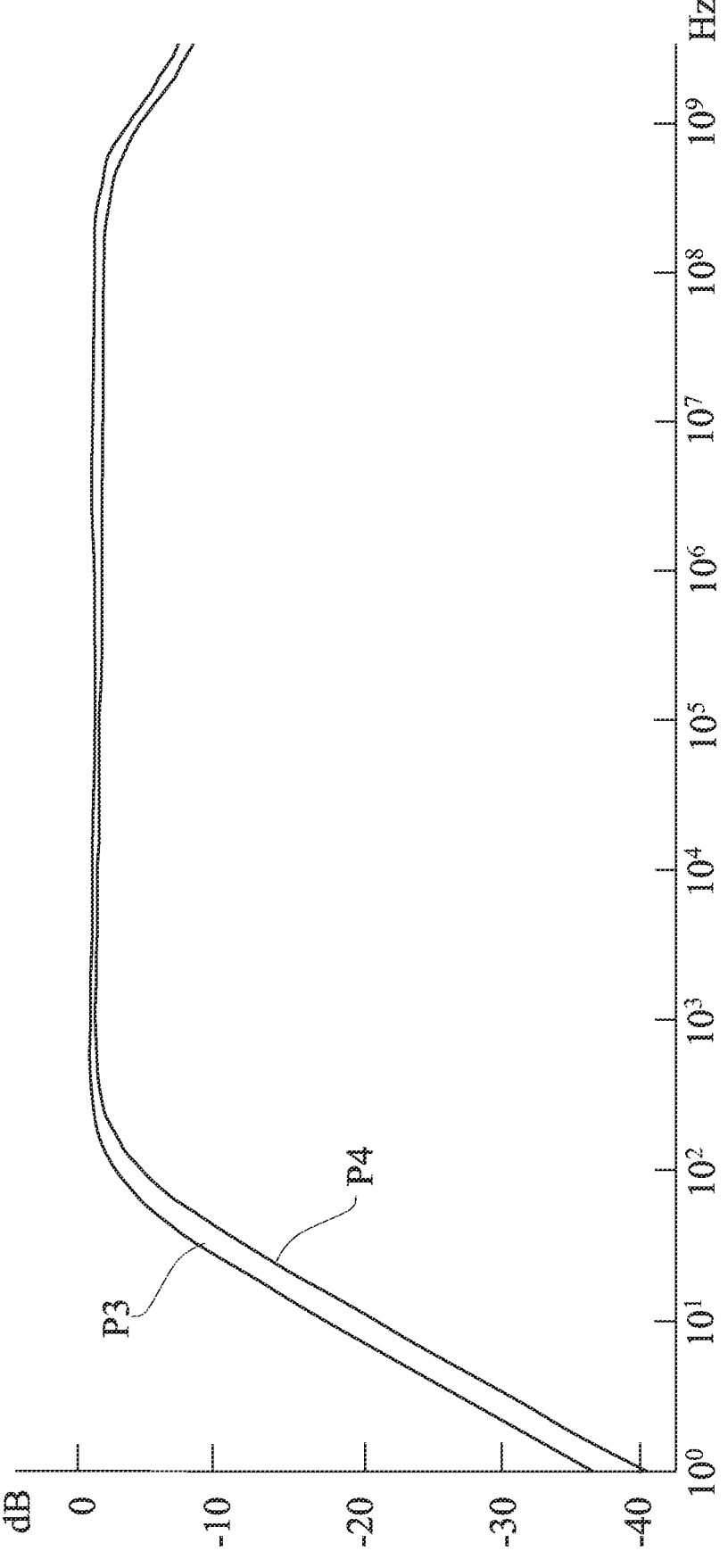
FIG. 10 shows a comparison result of SNR between a source follower circuit according to the present disclosure and a conventional source follower circuit.

FIG. 10 shows the comparison result of SNR between the source follower circuit according to the present disclosure and a conventional source follower circuit. The results can be obtained using simulation software, where the horizontal axis represents the frequency and the vertical represents the dB value of the output voltage VO, which is configured to reflect the response of the input voltage VIN to the output voltage VO. As can be seen in FIG. 10, compared with the response curve P4 of the conventional source follower circuit, the response curve P3 of the source follower circuit of the present disclosure has a higher dB value; that is, the input voltage VIN responds more strongly to the output voltage VO, and therefore has a better SNR.

What is claimed is:

1. A source follower circuit, configured to generate an output signal according to an input signal, the source follower circuit comprising:

a first transistor, having a drain coupled to a first reference voltage;

a second transistor, having a drain coupled to a source of the first transistor, wherein the first transistor and the second transistor both have polarization of a first type;

a first capacitor, coupled between a gate of the first transistor and the input signal;

a first resistor, coupled between the gate of the first transistor and a first bias voltage;

a third transistor, having a drain coupled to a second reference voltage;

a fourth transistor, having a drain coupled to a source of the third transistor, and the third transistor and the fourth transistor both have polarization of a second type different from the first type;

a third capacitor, coupled between a gate of the third transistor and the input signal;

a third resistor, coupled between the gate of the third transistor and a third bias voltage;

a fourth capacitor, coupled between a gate of the fourth transistor and the input signal; and a fourth resistor, coupled between the gate of the fourth transistor and a fourth bias voltage, wherein a gate of the second transistor is coupled to the input signal, a source of the second transistor outputs the output signal, wherein the first bias voltage is independent to the input signal, and the input signal is input directly to the gate of the second transistor, wherein a source of the fourth transistor is coupled to the source of the second transistor.

2. The source follower circuit of claim 1, wherein the first capacitor and the first resistor equivalently provide a gain less than 1 to the input signal and generate an attenuated input signal reflected at the gate of the first transistor.

3. The source follower circuit of claim 1, wherein the first type is N-type or P-type.

4. The source follower circuit of claim 1, wherein a path between the input signal and the gate of the fourth transistor do not pass through the third capacitor.

5. The source follower circuit of claim 1, wherein the third capacitor and the third resistor equivalently provide a gain less than 1 to the input signal and generate an attenuated input signal reflected at the gate of the third transistor.

6. A source follower circuit, configured to generate an output signal according to an input signal, the source follower circuit comprising:

a first transistor, having a drain coupled to a first reference voltage;

a second transistor, having a drain coupled to a source of the first transistor, wherein the first transistor and the second transistor both have polarization of a first type, wherein a source of the second transistor outputs the output signal;

a first capacitor, coupled between a gate of the first transistor and the input signal;

a first resistor, coupled between the gate of the first transistor and a first bias voltage;

a second capacitor, coupled between a gate of the second transistor and the input signal;

a second resistor, coupled between the gate of the second transistor and a second bias voltage;

a third transistor, having a drain coupled to a second reference voltage;

a fourth transistor, having a drain coupled to a source of the third transistor, wherein the third transistor and the fourth transistor both have polarization of a second type different from the first type, wherein a gate of the fourth transistor is coupled to the input signal, and a source of the fourth transistor is coupled to the source of the second transistor;

a third capacitor, coupled between a gate of the third transistor and the input signal; and a third resistor, coupled between the gate of the third transistor and a third bias voltage, wherein the input signal is input directly into the gate of the fourth transistor.

7. The source follower circuit of claim 6, wherein a path between the input signal and the gate of the second transistor does not pass through the first capacitor.

8. The source follower circuit of claim 6, wherein a capacitance of the second capacitor is greater than a capacitance of the first capacitor, such that the gate of the second transistor is subject to more influence from the input signal, compared with the gate of the first transistor.

9. The source follower circuit of claim 6, wherein the first type is N-type or P-type.

10. The source follower circuit of claim 6, wherein the third capacitor and the third resistor equivalently provide a gain less than 1 to the input signal and generate an attenuated input signal reflected at the gate of the third transistor.

11. A source follower circuit, configured to generate an output signal according to an input signal, the source follower circuit comprising:

a first transistor, having a drain coupled to a first reference voltage;

a second transistor, having a drain coupled to a source of the first transistor, wherein the first transistor and the second transistor both have polarization of a first type, wherein a gate of the second transistor is coupled to the input signal, a source of the second transistor outputs the output signal;

a first capacitor, coupled between a gate of the first transistor and the input signal;

a first resistor, coupled between the gate of the first transistor and a first bias voltage;

a third transistor, having a drain coupled to a second reference voltage;

a fourth transistor, having a drain coupled to a source of the third transistor, wherein the third transistor and the fourth transistor both have polarization of a second type different from the first type, wherein a gate of the fourth transistor is coupled to the input signal, a source of the fourth transistor is coupled to the source of the second transistor;

a third capacitor, coupled between a gate of the third transistor and the input signal; and a third resistor, coupled between the gate of the third transistor and a third bias voltage, wherein the input signal is input directly to the gate of the fourth transistor.

12. The source follower circuit of claim 11, wherein the third capacitor and the third resistor equivalently provide a gain less than 1 to the input signal and generate an attenuated input signal reflected at the gate of the third transistor.

* * * * *